(12) United States Patent
Chao et al.

(10) Patent No.: US 8,143,633 B2
(45) Date of Patent: Mar. 27, 2012

(54) LED PACKAGE STRUCTURE AND MANUFACTURING PROCESS THEREOF

(75) Inventors: Yin-Cheng Chao, Sanxia Township, Taipei County (TW); Yu-Bing Lan, Banciao (TW); Pei-Hsuan Lan, Banciao (TW); Jui-Hung Chen, Taoyuan (TW)

(73) Assignee: Forward Electronics Co., Ltd. (TW)

( * ) Notice: Subject to any disclaimer, the term of this patent is extended or adjusted under 35 U.S.C. 154(b) by 126 days.

(21) Appl. No.: 12/662,727

(22) Filed: Apr. 30, 2010

(65) Prior Publication Data

US 2011/0089461 A1    Apr. 21, 2011

(30) Foreign Application Priority Data

Oct. 20, 2009   (TW) ............................... 98135393 A

(51) Int. Cl.
*H01L 33/00* (2010.01)
(52) U.S. Cl. ............................... 257/89; 257/98; 257/99
(58) Field of Classification Search ............ 257/79–103, 257/E33.057, E33.01
See application file for complete search history.

(56) References Cited

U.S. PATENT DOCUMENTS

| 7,960,819 | B2 * | 6/2011 | Loh et al. | 257/99 |
| 8,030,675 | B2 * | 10/2011 | Inoguchi | 257/98 |
| 8,044,418 | B2 * | 10/2011 | Loh et al. | 257/98 |
| 8,049,230 | B2 * | 11/2011 | Chan et al. | 257/89 |

* cited by examiner

*Primary Examiner* — Cuong Q Nguyen
(74) *Attorney, Agent, or Firm* — Bacon & Thomas, PLLC

(57) ABSTRACT

A process for manufacturing an LED package structure includes the following steps: (A) providing a T-shaped heat-sink block and an integral material sheet, wherein the T-shaped heat-sink block includes a base portion and a rise portion extending from the base portion, and wherein the integral material sheet includes a side frame and a pair of electrode lead frames extending, respectively, from two opposite internal sides of the side frame; (B) forming an insulating layer on an upper surface of the base portion; (C) disposing the electrode lead frames on the insulating layer; and (D) forming an insulating outer frame around the T-shaped heat-sink block, wherein the insulating layer is enveloped in the insulating outer frame, and part of the base portion of the heat-sink block exposes out of the insulating outer frame. As a result, the LED package structure can improve voltage resistance and insulation.

6 Claims, 5 Drawing Sheets

LED PACKAGE STRUCTURE AND MANUFACTURING PROCESS THEREOF

BACKGROUND OF THE INVENTION

1. Field of the Invention

The present invention relates to an LED (light emitting diode) package structure and a manufacturing process thereof, and more particularly, to an LED package structure and a manufacturing process thereof adapted for alternate current light emitting diodes (AC LEDs).

2. Description of Related Art

Referring to FIG. 1, an exploded view illustrating a conventional LED package structure, to FIG. 2, a cross-sectional view illustrating the conventional LED package structure, and to FIG. 3, a perspective view illustrating the conventional LED package structure formed with an insulating outer frame, in the conventional LED package structure, positive and negative electrode lead frames come from an integral material sheet 13, namely, a known integral material sheet 13 includes a rectangular side frame 131, a pair of electrode lead frames 132a,132b, and a pair of supports 133a,133b. The two electrode lead frames 132a,132b extend, respectively, from two parallel internal sides of the rectangular side frame 131, whereas the two supports 133a,133b extend, respectively, from other two parallel internal sides of the rectangular side frame 131. Both the two supports 133a,133b are connected with a positioning collar 134, while the two electrode lead frames 132a,132b are spaced apart from the positioning collar 134.

In manufacturing the conventional LED package structure, a circular heat-sink block 10 (including a base position 11, and a rise portion 12 protruded from the base position 11) is positioned in the integral material sheet 13. Then, in cooperation with molding, an insulating outer frame 14 is formed eventually by injection of an insulating plastic material, as shown in FIG. 2. The gap between the electrode lead frames 132a,132b and the positioning collar 134, between the positioning collar 134 and the rise portion 12 horizontally, between the electrode lead frames 132a,132b and the base position 11, and between the positioning collar 134 and the base position 11 vertically, are filled with the insulating plastic material in the same step of process. The base position 11 of the heat-sink block 10 will be exposed, in part (so-called "exposing area 111"), out of the insulating outer frame 14. Thereafter, a further step in removing the supports 133a,133b is necessary, because the supports 133a,133b, though useless for a final product of LED, are required for fixing the heat-sink block 10 during the manufacturing process.

However, there are several disadvantages for the conventional LED package structure in respect of electrical insulation, particularly in the occasion of using alternate current, namely:

Firstly, a supporting mechanism is necessary in order to maintain a particular vertical gap between the electrode lead frames 132a,132b and the heat-sink block 10 such that the subsequent injection molding material can be filled therein, for instance, a mold-auxiliary measure can be adopted. In case the supporting mechanism is unsatisfactory, the electrode lead frames 132a,132b may possibly oblique and fail to be parallel completely with a top surface of the base position 11 of the heat-sink block 10. As a result, a vertical spacing H1 between the electrode lead frames 132a,132b and the heat-sink block 10 cannot be maintained at a predetermined safety value everywhere therebetween.

Secondly, after injection of the insulating plastic material, the gaps supposed to be filled completely may on the other hand not be filled completely, and this may bring forth a risk that an electric ark might penetrate into the heat-sink block 10.

Thirdly, even though the supports 133a,133b are eventually cut off, metal burrs 15 are often left thereon, and this would result in an electric arc discharge route which is destructive to electric voltage resistance.

Fourthly, in the conventional LED package structure, the exposing area 111 of the heat-sink block 10 and the electrode lead frame area, which is not enveloped by the insulating outer frame 14, are apart from each other at a horizontal distance D1 mostly less than 2 mm. This will often results in an electric arc conduction.

It has been a main trend for electric components to meet safety requirements for voltage resistance. To avoid electric shock caused by short circuit at insulation portions, such that safety requirements for CE and UL must reach to a voltage resistance of (1000+2U)V where "U" refers to a "working voltage," a solution to solve the problems becomes a demand.

SUMMARY OF THE INVENTION

An object of the present invention is to provide a process for manufacturing an LED package structure, comprising the following steps:

(A) providing a T-shaped heat-sink block and an integral material sheet, wherein the T-shaped heat-sink block includes a base portion and a rise portion extending from the base portion, and wherein the integral material sheet includes a side frame and a pair of electrode lead frames extending, respectively, from two opposite internal sides of the side frame;

(B) forming an insulating layer on an upper surface of the base portion;

(C) disposing the electrode lead frames on the insulating layer; and (D) forming an insulating outer frame around the T-shaped heat-sink block, wherein the insulating layer is enveloped in the insulating outer frame, and part of the base portion of the heat-sink block exposes out of the insulating outer frame so as to form an exposing area.

By using the manufacturing process, according to the present invention, the problem of poor voltage resistance and insulation can be fully improved. That is to say, the situation that the insulating material, under a measure of plastic injection, is not completely filled between the electrode lead frames and the T-shaped heat-sink block can be prevented. Nor the LED package structure, so obtained, will run a potential risk that metal burrs are left thereon and result in an electric arc discharge route.

In step (B), either an insulating pad can be disposed on the upper surface of the base portion, or an insulating material be coated on the upper surface of the base portion. Preferably, the exposing area, as described in step (D), is apart from the electrode lead frames at a distance horizontally greater than 2 mm.

In step (A), the indicated "providing a T-shaped heat-sink block," may refer to "cutting a T-shaped heat-sink block, which has a circular lower portion, at its lower portion, such that the exposing area is apart from the electrode lead frames at a distance horizontally greater than 2 mm."

The process for manufacturing the LED package structure, according to the present invention, may further comprise step (E) in removing the side frame of the integral material sheet.

Another object of the present invention is to provide an LED package structure comprising a T-shaped heat-sink block, an insulating pad, a paired electrode lead frames, and an insulating outer frame. The T-shaped heat-sink block includes a base portion and a rise portion extending from the base portion.

The insulating pad is supported on the base portion, with the electrode lead frames supported, respectively, on the insulating pad. The insulating outer frame envelops the insulating pad, part of the electrode lead frames, and part of the base portion, wherein the insulating pad is made of a material varied from that of the insulating outer frame.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
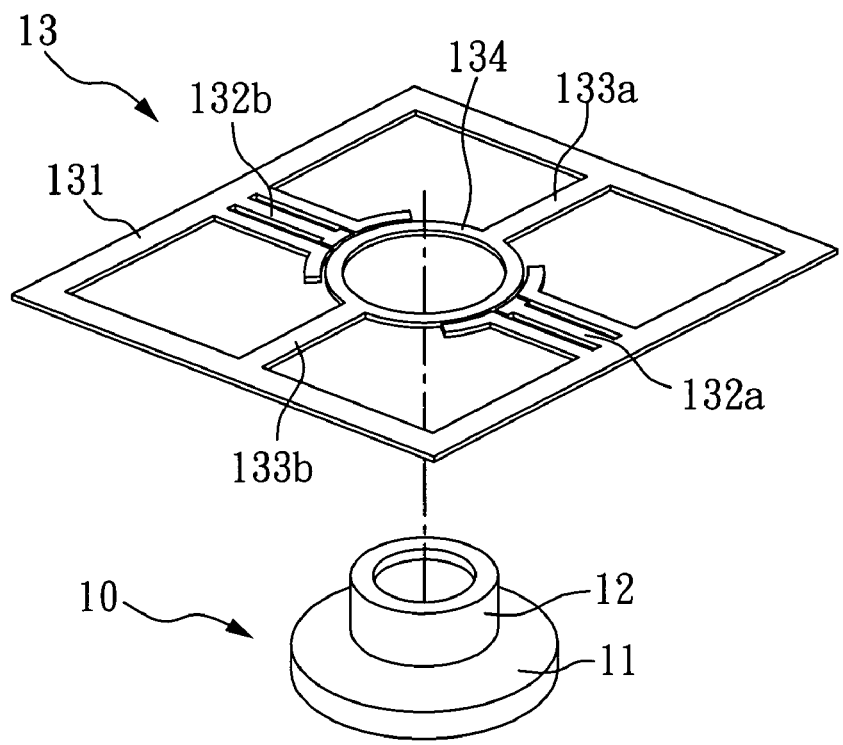
FIG. 1 is an exploded view illustrating a conventional LED package structure.
Figure 2:
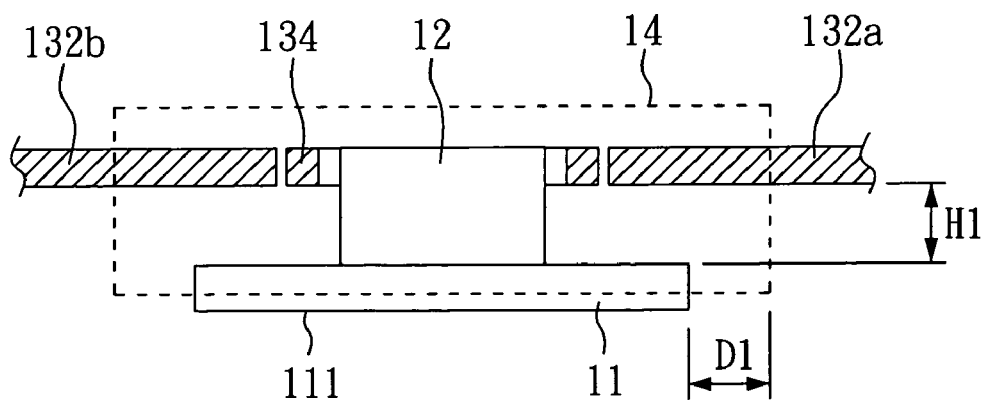
FIG. 2 is a cross-sectional view illustrating the conventional LED package structure.
Figure 3:
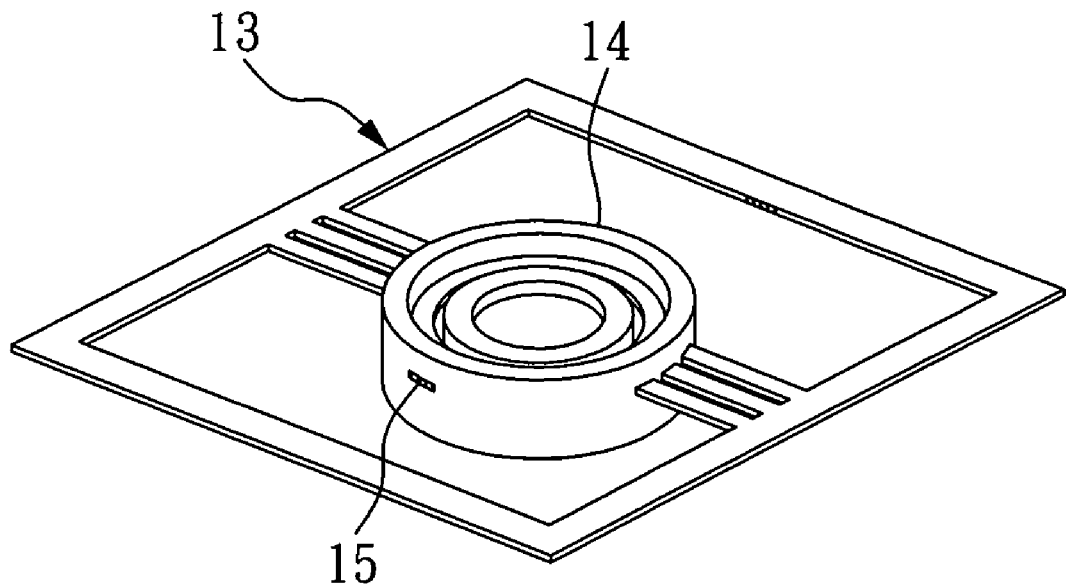
FIG. 3 is a perspective view illustrating the conventional LED package structure formed with an insulating outer frame.
Figure 4:
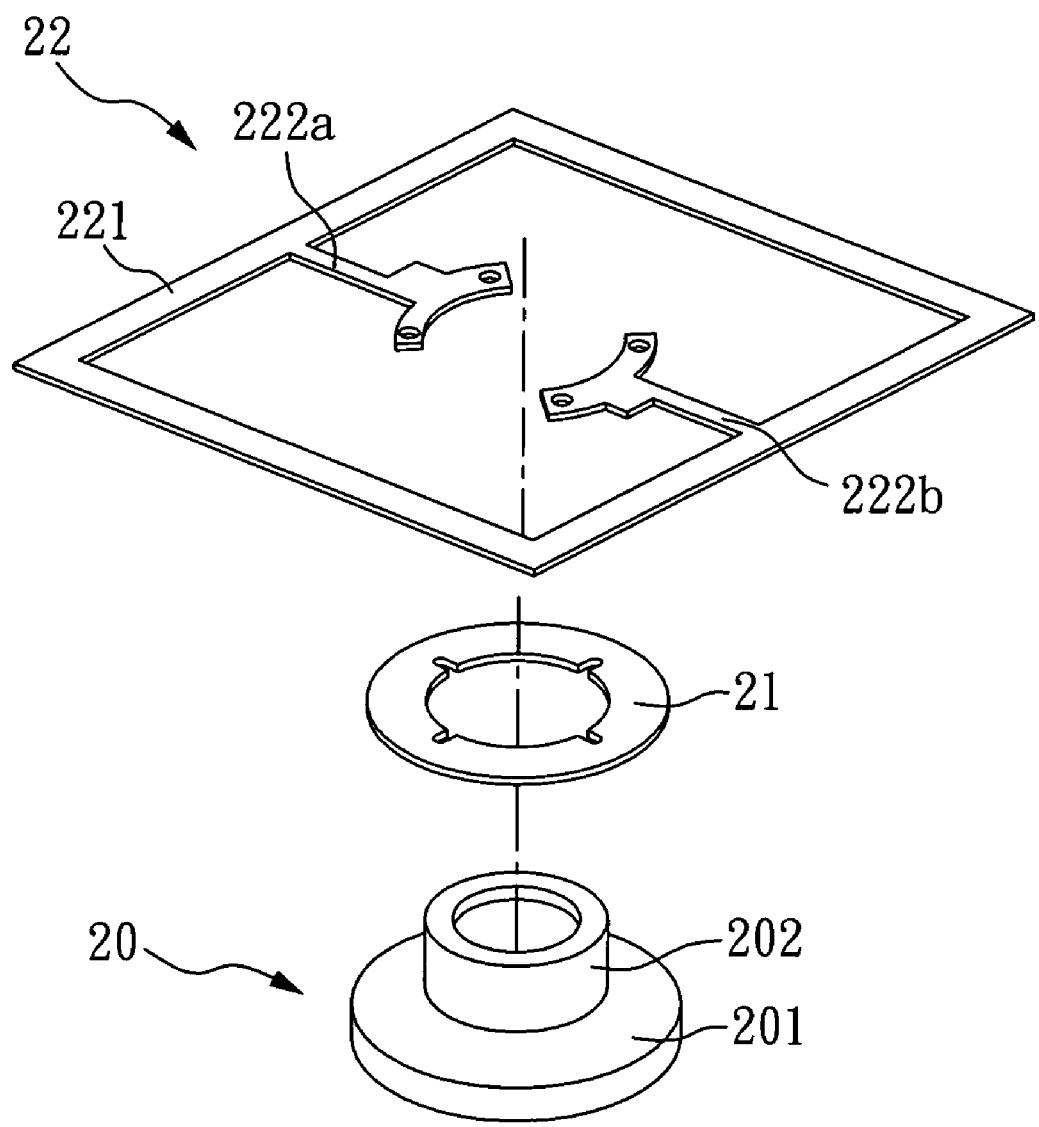
FIG. 4 is an exploded view illustrating an LED package structure according to the present invention.
Figure 5:
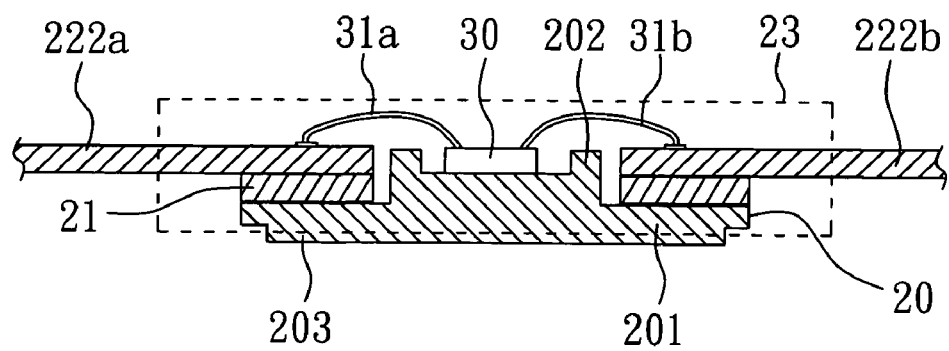
FIG. 5 is a cross-sectional view illustrating the LED package structure according to the present invention.
Figure 6:
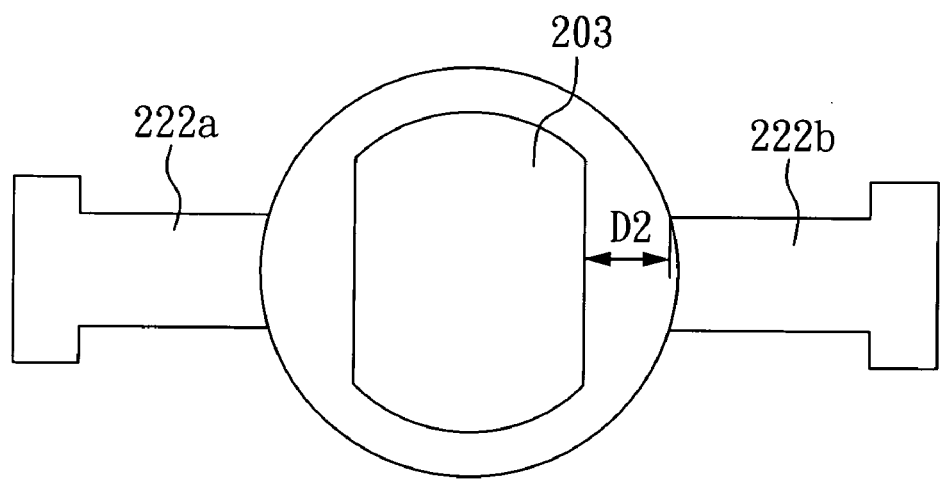
FIG. 6 is a bottom view of the LED package structure according to the present invention.

Referring to FIG. 4, an exploded view illustrating an LED package structure according to the present invention, to FIG. 5, a cross-sectional view illustrating the LED package structure, and to FIG. 6. a bottom view of the LED package structure, the LED package structure, relating to an alternate current (AC) LED structure, comprises a T-shaped heat-sink block 20, an insulating pad 21 acting as an insulation layer, a paired electrode lead frames 222a,222b, an insulating outer frame 23, and an LED chip 30. The T-shaped heat-sink block 20 includes a base portion 201 and a rise portion 202, wherein the rise portion 202 extends from the base portion 201.

The insulating pad 21 passes through the rise portion 202 and is supported on a top surface of the base portion 201, with the paired electrode lead frames 222a,222b disposed, respectively, on the insulating pad 21 oppositely. The insulating outer frame 23 surrounds the heat-sink block 20 and envelops the insulating pad 21, part of the electrode lead frames 222a, 222b, and part of the base portion 201, wherein a portion of the base portion 201, which exposes out of the insulating outer frame 23, is formed as an exposing area 203. In the present invention, the insulating pad 21 is made of a material varied from that of the insulating outer frame 23.

The rise portion 202 of the T-shaped heat-sink block 20 is shaped as a cup for receiving the LED chip 30. The LED chip 30 is electrically connected with the paired electrode lead frames 222a,222b through two wires 31a,31b.

It should be noted that the T-shaped heat-sink block 20 and the exposing area 203 are apart from each other at a distance D2 greater than 2 mm, as shown in FIG. 6.

Figure 7:
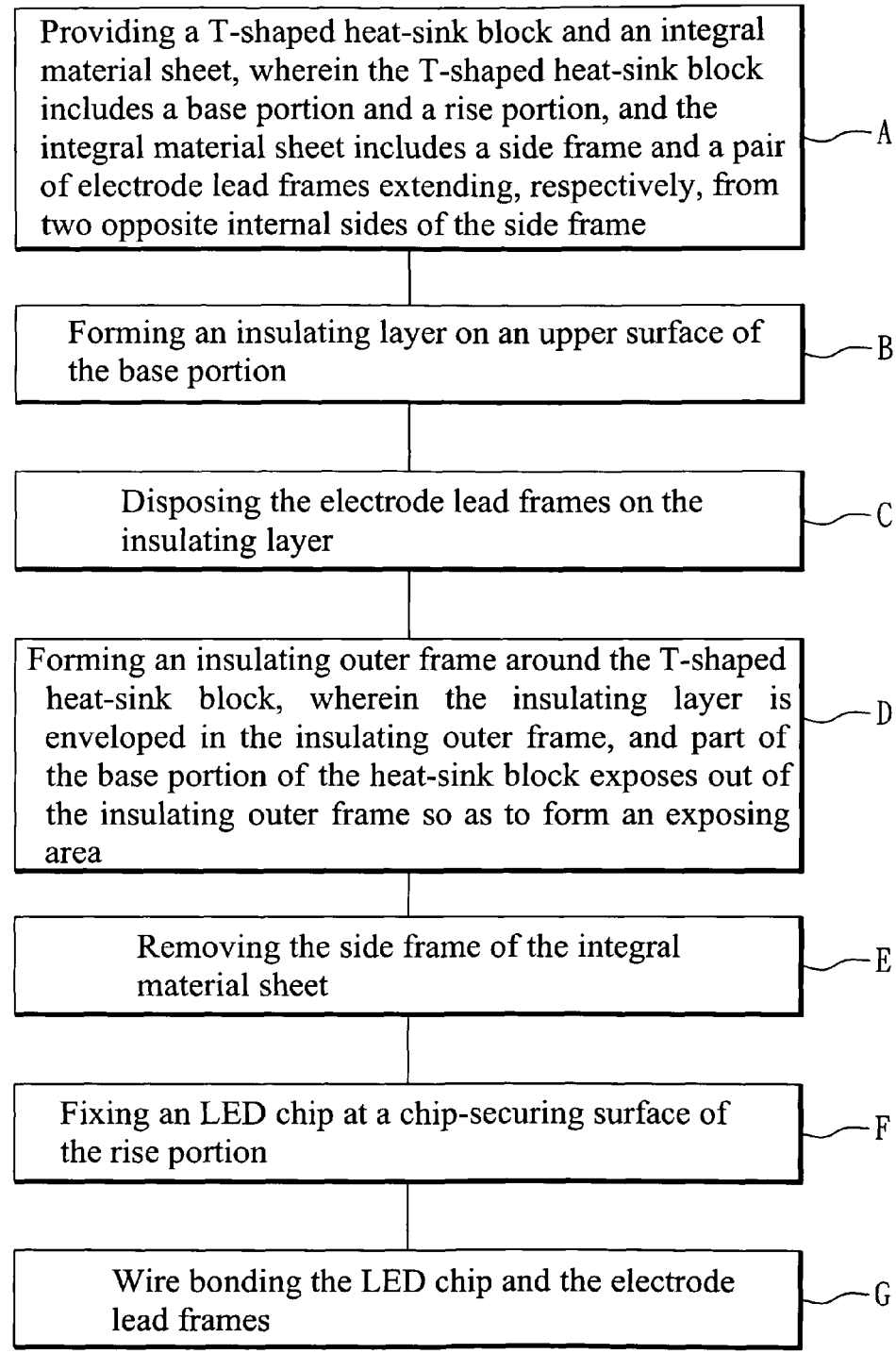
FIG. 7 is a flowchart illustrating a process for manufacturing the LED package structure according to the present invention.

Further referring to FIG. 7, a flowchart illustrating a process for manufacturing the LED package structure according to the present invention, the process comprises the following steps:

(A) Providing a T-shaped heat-sink block 20 and an integral material sheet 22, wherein the T-shaped heat-sink block 20 includes a base portion 201 and a rise portion 202 extending from the base portion 201. The integral material sheet 22 includes a side frame 221 and a pair of electrode lead frames 222a,222b extending, respectively, from two opposite internal sides of the side frame 221.

(B) Forming an insulating layer on an upper surface of the base portion 201 by, for instance, disposing an insulating pad 21 on the upper surface of the base portion 201. Of course, coating an insulating material on the upper surface of the base portion 201 will also do.

(C) Disposing the paired electrode lead frames 222a,222b on the insulating layer by, for instance, locating the integral material sheet 22, which includes the side frame 221, with the paired electrode lead frames 222a,222b aligning the insulating layer.

(D) Forming an insulating outer frame 23 around the T-shaped heat-sink block 20, wherein the insulating layer is enveloped in the insulating outer frame 23. This step can be achieved by an ordinary plastic molding injection. After forming of the insulating outer frame 23, part of the base portion 201 of the heat-sink block 20 exposes out of the insulating outer frame 23 so as to form an exposing area 203.

Preferably, the exposing area 203 is apart from the electrode lead frames 222a,222b at a distance horizontally greater than 2 mm. To meet this requirement, the T-shaped heat-sink block 20, which has a circular lower portion, can be cut at its circular lower portion, as shown in FIG. 6. Of course, the T-shaped heat-sink block 20 can be pre-revised in dimension so as to be formed directly at a size meeting the requirement of a desired T-shaped heat-sink block 20.

(E) Removing the side frame 221 of the integral material sheet 22 which is then useless.

(F) Fixing an LED chip 30 at a chip-securing surface of the rise portion 202.

(G) Wire bonding the LED chip 30 and the electrode lead frames 222a,222b, as shown in FIG. 5 for wires 31a,31b.

Given the above, it is understood that, according to the present invention, prior to forming the insulating outer frame 23, the insulating layer is first used to envelop the T-shaped heat-sink block 20, and then the electrode lead frames 222a, 222b are positioned directly on the insulating layer. This will assure that the electrode lead frames 222a,222b and the T-shaped heat-sink block 20 maintain a uniform and particular vertical distance. Unlike the conventional art that in the step of forming the insulating outer frame, insulating material is filled at the same time in the gap of the vertical distance, running a potential risk that the gap is not completely filled and that air exists in the gap. Therefore, the LED package structure made according to the manufacturing process of the present invention can meet the safety requirements for voltage resistance. Because the integral material sheet, according to the manufacturing process of the present invention, does not need the supports and the positioning collar, it is possible to prevent the supports from becoming electric arc discharge routes resulted in the conventional art.

Further, the feature of the present invention that the exposing area 203 is apart from the electrode lead frames 222a, 222b at a distance horizontally greater than 2 mm can avoid the LED package structure from short circuit at the lower portion thereof due to electric arc discharge.

Although the present invention has been explained in relation to its preferred embodiments, it is to be understood that many other possible modifications and variations can be made without departing from the scope of the invention as hereinafter claimed.

What is claimed is:

1. A process for manufacturing an LED package structure, comprising the following steps:
   (A) providing a T-shaped heat-sink block and an integral material sheet, wherein the T-shaped heat-sink block includes a base portion and a rise portion extending from the base portion, and wherein the integral material sheet includes a side frame and a pair of electrode lead frames extending, respectively, from two opposite internal sides of the side frame;
   (B) forming an insulating layer on an upper surface of the base portion;
   (C) disposing the paired electrode lead frames on the insulating layer; and
   (D) forming an insulating outer frame around the T-shaped heat-sink block, wherein the insulating layer is enveloped in the insulating outer frame, and part of the base portion of the heat-sink block exposes out of the insulating outer frame so as to form an exposing area.

2. The process as claimed in claim 1, wherein step (B) refers to disposing an insulating pad on the upper surface of the base portion.

3. The process as claimed in claim 1, wherein step (B) refers to coating an insulating material on the upper surface of the base portion.

4. The process as claimed in claim 1, wherein the exposing area, as described in step (D), is apart from the paired electrode lead frames at a distance horizontally greater than 2 mm.

5. The process as claimed in claim 4, wherein the indicated "providing a T-shaped heat-sink block" in step (A) refers to "cutting a T-shaped heat-sink block, which has a circular lower portion, at its lower portion, such that the exposing area is apart from the paired electrode lead frames at a distance horizontally greater than 2 mm.

6. The process as claimed in claim 1, further comprising step (E): removing the side frame of the integral material sheet.

* * * * *